US006589413B2

United States Patent
Lee et al.

(10) Patent No.: US 6,589,413 B2
(45) Date of Patent: Jul. 8, 2003

(54) METHOD OF MAKING A COPPER ON INVAR® COMPOSITE

(75) Inventors: Chin-Ho Lee, Lyndhurst, OH (US); Thomas J. Ameen, Mentor, OH (US); John P. Callahan, Mentor, OH (US)

(73) Assignee: Gould Electronics Inc., Eastlake, OH (US)

( * ) Notice: Subject to any disclaimer, the term of this patent is extended or adjusted under 35 U.S.C. 154(b) by 0 days.

(21) Appl. No.: 09/925,680

(22) Filed: Aug. 9, 2001

(65) Prior Publication Data

US 2003/0029730 A1 Feb. 13, 2003

(51) Int. Cl.[7] ............................................. C25D 7/06
(52) U.S. Cl. ...................... 205/138; 205/182; 205/184; 205/218; 205/291; 205/293
(58) Field of Search ................... 205/138, 182, 205/218, 291, 293, 296, 184, 186, 187

(56) References Cited

U.S. PATENT DOCUMENTS 5,011,655 A   4/1991   Mankins .................. 419/8
6,190,939 B1 * 2/2001   Burns .................... 438/106

OTHER PUBLICATIONS

F.A. Lowenheim. Electroplating, McGraw–Hill Book Co, New York pp 74–77, 82–83, 88–89, 99–101, 106–111, 194–205, 1978 Month of Publication Not Available.*

Texas Instruments brochure entitled: "Clad Meat Copper Clad Invar," 1983, 3 pgs. Month of Publication is Not Available.

Texas Instruments brochure entitled: "Copper/Invar/Copper Material Specification/Data Sheet," Dec. 1987, 4 pages.

* cited by examiner

*Primary Examiner*—Roy King
*Assistant Examiner*—William T. Leader
(74) *Attorney, Agent, or Firm*—Mark Kusner; Michael A. Jaffe

(57) ABSTRACT

A composite for use in forming a multi-layer printed circuit board, comprised of an INVAR® sheet having a thickness of between 0.5 mil and 5 mil; and a layer of electrodeposited copper on at least one side thereof. The copper has a thickness of between $1\mu$ and $50\mu$, wherein the composite has a thermal coefficient of expansion (TCE) of about 2.8 to 6.0 ppm at temperatures between 0° F. and 200° F.

15 Claims, 1 Drawing Sheet

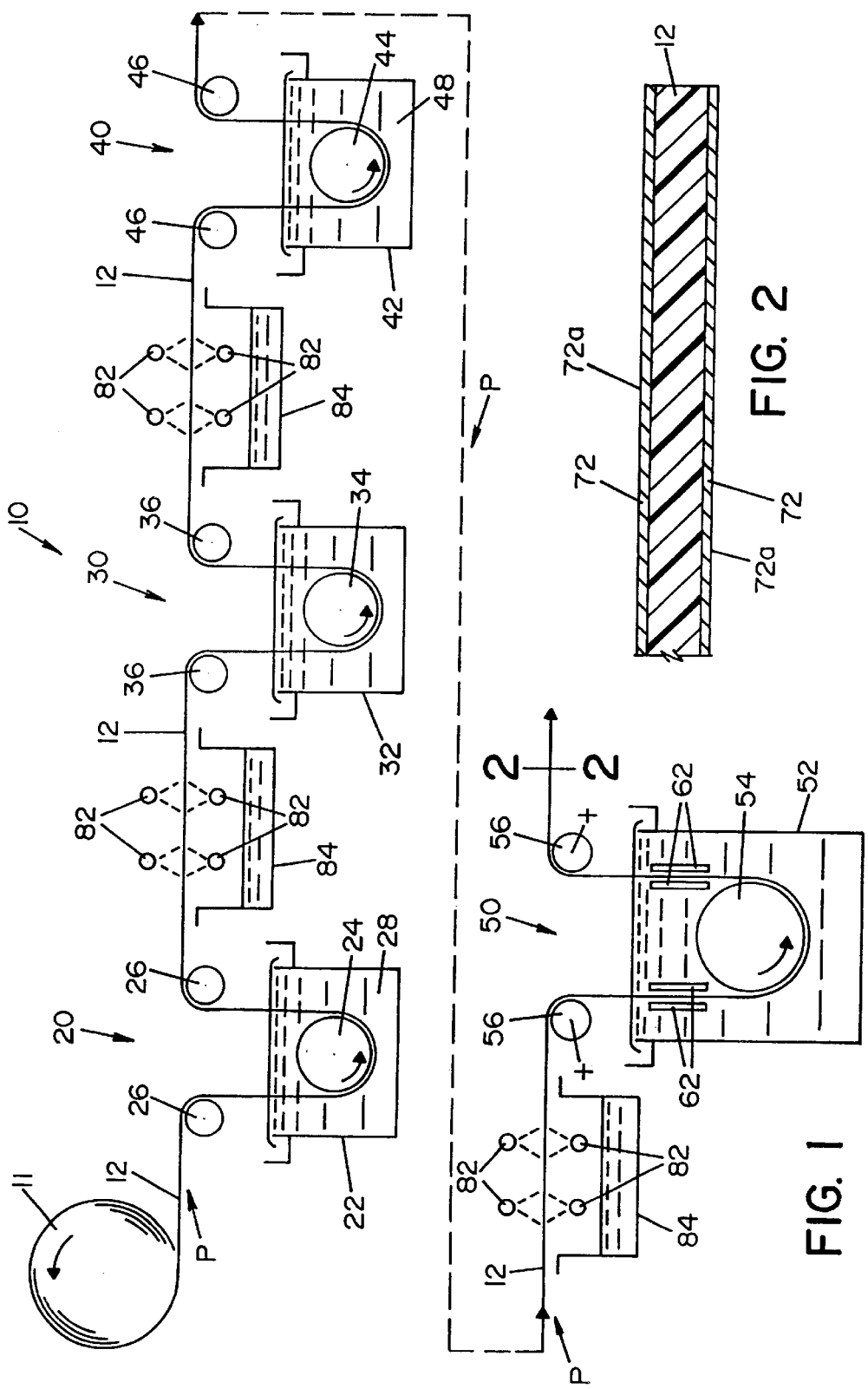

METHOD OF MAKING A COPPER ON INVAR® COMPOSITE

FIELD OF THE INVENTION

The present invention relates to a composite for use in forming multilayer printed circuit boards, and more particularly to a copper on INVAR® composite.

BACKGROUND OF THE INVENTION

INVAR® (a registered trademark of Imphy S.A.) is a nickel-iron alloy containing about 36% nickel and 64% iron. It has been known to use copper/INVAR®/copper composite materials in the manufacture of printed circuit boards because of its low thermal coefficient of expansion (TCE). In this respect, copper/INVAR®/copper composite materials are commonly used in printed circuit boards as ground planes, power planes and/or metal cores, hybrid enclosures, heat sinks, and other areas where thermal coefficient of expansion matching is required or beneficial.

Heretofore, copper/INVAR®/copper composite materials were produced by metallurgically bonding two copper layers onto each side of an INVAR® layer. This mechanical process basically required rolling the respective layers together under pressure. A problem with metallurgically bonding a copper layer to an INVAR® layer is the inability of producing composite materials thinner than 2 mil. In addition, the metallurgical properties of the resulting copper/INVAR®/copper composites are not consistent throughout the resulting composite.

The present invention overcomes these and other problems and provides a copper on INVAR® composite that is thinner than copper/INVAR®/copper composites known heretofore, and that has more uniform consistent, metallurgical properties.

SUMMARY OF THE INVENTION

In accordance with a preferred embodiment of the present invention, there is provided a method of forming a copper on INVAR® composite comprising the steps of:

conveying a generally continuous strip of INVAR® along a path having a plurality of locations;

at a first location, cleaning the strip in an alkaline solution;

at a second location, cleaning the strip in an acid solution;

at a third location, applying a copper strike layer to the strip; and at a fourth location, electrodepositing copper onto the strike layer.

In accordance with another aspect of the present invention, there is provided a composite for use in forming a multi-layer printed circuit board, comprised of an INVAR® sheet having a thickness of between 0.5 mil and 5 mil; and a layer of electrodeposited copper on at least one side thereof. The copper has a thickness of between $1\mu$ and $50\mu$. The composite has a thermal coefficient of expansion (TCE) of about 2.8 to 6.0 ppm at temperatures between 0° F. and 200° F.

It is an object of the present invention to provide a copper on INVAR® composite that is thinner than similar composites formed by a metallurgical bonding process.

It is another object of the present invention to provide a composite as described above that has more consistent metallurgical properties than a metallurgically bonded composite.

It is another object of the present invention to provide a composite as described above that has a thermal coefficient of expansion of about 2.8 to 6.0 ppm at temperatures between 0° F. and 200° F.

These and other objects will become apparent from the following description of a preferred embodiment taken together with the accompanying drawings and the appended claims.

BRIEF DESCRIPTION OF THE DRAWINGS

The invention may take physical form in certain parts and arrangement of parts, a preferred embodiment of which will be described in detail in the specification and illustrated in the accompanying drawings which form a part hereof, and wherein:

FIG. 1 is a schematic representation of a generally continuous process for forming a copper on INVAR® composite; and FIG. 2 is a cross-sectional view of a copper on INVAR® composite, illustrating a preferred embodiment of the present invention.

DETAILED DESCRIPTION OF PREFERRED EMBODIMENT

The present invention relates to a method of forming copper on a nickel-iron alloy surface, and a composite formed thereby. The present invention is particularly applicable to forming a copper clad INVAR® sheet and will be described with particular reference thereto, although it will be appreciated that the present invention has other, broader applications in applying copper onto the surface of a nickel-iron alloy component.

Referring now to the drawings, wherein the showings are for the purpose of illustrating a preferred embodiment of the invention only, and not for the purpose of limiting same, FIG. 1 is a schematic view of a generally continuous manufacturing process 10 for applying copper onto a strip 12 of INVAR®, illustrating a preferred embodiment of the present invention. In the embodiment shown, a roll 11 provides a generally continuous strip 12 of INVAR®. Strip 12 is conveyed along a generally continuous path, designated P in the drawings, having a plurality of locations there along.

INVAR® strip 12 preferably undergoes a first cleaning process, at a first location designated 20, to remove organic impurities, such as grease, oil and the like, from the surface of strip 12. In the embodiment shown, strip 12 is conveyed into a tank 22 around a main roller 24 by means of guide rollers 26. Tank 22 contains an alkaline solution 28 to remove grease and oil from strip 12. A typical alkaline solution for cleaning strip 12 may include about 20 g/l NaOH, about 40 g/l $Na_3PO_4$ and about 20 g/l $Na_2CO_3$.

After the alkaline cleaning at location 20, strip 12 undergoes a rinsing process, wherein spray elements 82 disposed above and below strip 12 spray the surfaces of strip 12 with water. The rinse water is collected by tank 84 disposed beneath spray elements 82.

Following alkaline cleaning at location 20, strip 12 undergoes an acid etch intended to remove surface oxides and residual and inorganic impurities, at a second location, designated 30. Strip 12 is directed into a tank 32 around a main roller 34. Strip 12 is positioned relative to main roller 34 by guide rollers 36. Tank 32 contains an acid solution. In accordance with one embodiment of the present invention, the acid solution is comprised of an aqueous 1:1 diluted HCl solution.

Following the acid etch at location 30, strip 12 undergoes another rinsing process as heretofore described, wherein spray elements 82 disposed above and below strip 12 spray the surfaces of strip 12 with water to remove residual acid therefrom.

Following the acid etch at location 30, and subsequent rinsing, strip 12 undergoes a metal strike process at a third location, designated 40. A metal strike layer may be applied by a vacuum deposition process, by way of example and not limitation, sputtering, or by chemical deposition. The metal strike layer is preferably copper. In a preferred embodiment, strip 12 is directed into a tank 42 around a main roll 44. Strip 12 is directed into tank 42 by guide rollers designated 46. Tank 42 contains an acid copper solution 48, but it is preferable to use a copper pyro or copper cyanide solution. Acid copper solution 48 preferably contains 2–5 g/l $Cu^{2+}$ and 50 g/l $H_2SO_4$. Strip 12 is preferably exposed to acid copper solution 48 for a period of time sufficient to produce a strike layer of copper on strip 12 having a thickness of about $0.05\mu$ to about $0.1\mu$.

Following application of a copper strike layer at location 40, strip 12 undergoes another rinsing operation as schematically illustrated in the drawings. The rinsing operation is similar to that heretofore described, and shall not be described in detail.

Following the copper strike process at location 40, and the subsequent rinsing process, strip 12, with a copper strike layer thereon, undergoes a copper buildup process at a location 50. The copper buildup process is an electrodeposition process adapted to buildup a copper layer(s) 72 onto the surface(s) 72a of the copper-striked strip 12.

Broadly stated, strip 12 is immersed in an electrolyte bath adjacent an electrode 62. The electrolyte bath is basically comprised of an acid solution containing copper ions, $Cu^{2+}$. The chemistry of the electrolyte bath is as follows:

$Cu^{2+}$>40 g/l

Acid>30 g/l

The electrolyte bath is preferably maintained between 45° C. and 90° C.

Strip 12 is connected to a cathodic source, and electrode 62 is connected to an anodic source to form an electrolytic cell.

In a preferred embodiment, strip 12 is directed into a tank 52 around a main drum or roller 54. Strip 12 is guided around drum 54 by guide rollers 56. Tank 52 contains an electrolytic solution. The electrolytic solution preferably has the following chemistry:

40 to 70 g/l $Cu^{+2}$ 30 to 50 g/l $H_2SO_4$

<3 ppm $Cl^-$

In accordance with one embodiment of the present invention, the electrolytic solution contains about 70 g/l $Cu^{+2}$, about 50 g/l $H_2SO_4$ and a low level of chloride (<3 ppm). The electrolytic solution is maintained at a temperature of about 60° C. by a conventional heating and cooling apparatus (not shown). As shown in FIG. 1, anodes 62 are disposed on opposite sides of strip 12. A plating current density that ranges from 80 to 150 amps per square foot is applied to anodes 62. Rollers 56 are cathodic rollers to effect plating of copper onto strip 12. The plating time that is used is usually in the range of about 1 minute to about 15 minutes depending on the desired thickness of copper layers 72. FIG. 2 is an enlarged, cross-sectional view of strip 12 with copper layers 72 on each side thereof.

In a preferred embodiment of the present invention, a copper layer 72 preferably has a thickness of between $1\mu$ and $50\mu$, and more preferably, has a thickness of between $4\mu$ and $25\mu$.

Surfaces 72a of copper layer 72 can be a "standard-profile surface," a "low-profile surface" or a "very-low-profile surface." The term "standard-profile surface" is used herein to refer to a foil surface having an $R_{tm}$ (IPC-MF-150F) of greater than 10.2 microns. The term "low-profile surface" refers to a foil surface having an $R_{tm}$ (IPC-MF-150F) of less than $10.2\mu$. The term "very-low-profile surface" refers to a foil surface having an $R_{tm}$ (IPC-MF-150F) of less than $5.1\mu$. $R_{tm}$ (IPC-MF-150F) is the mean of the maximum peak to valley vertical measurements from each of five consecutive sampling measurements, and can be measured using a SURTRONIC® 3 profilometer marketed by Rank Taylor Hobson, Ltd., Leicester, England. Useful embodiments involve the use of foils with standard-profile surfaces.

In accordance with one embodiment of the present invention, the copper electrodeposition process is conducted under conditions to produce a matte, outer surface 72a having an outer surface profile between 2 and 10 $\mu$m $R_{tm}$. Roughened, outer surface 72a facilitates better adhesion of strip 12 to a dielectric layer or to another surface.

Surface 72a may include surface treatment typically applied to copper to promote adhesion of a dielectric substrate or to provide other properties. Surface 72a of a copper layer 72 may be treated or untreated without deviating from the present invention.

Copper layer 72 of the present invention may be characterized by the absence of any added surface roughening treatment on base surface 72a. The term "base surface" refers to surface 72a which has not been subjected to any subsequent treatments of the type discussed below for refining or enhancing foil properties and/or increasing surface roughness. The term "added surface roughening" refers to any treatment performed on base surface 72a of copper layer 72 for the purpose of increasing the roughness of the surface of the copper.

Metal treatments include copper or zinc deposited electrolytically in nodular or dendritic form and copper oxide which grows in nodular or dendritic form on base surface 72a of copper layer 72. Copper having a naturally occurring relatively rough layer (saw-tooth shape) on base surface 72a is not excluded from being within the scope of the present invention.

In one embodiment, mechanical roughness imparted to copper layer 72 during rolling or by subsequent abrasion that increases roughness beyond that of a standard profile surface is considered to be an added surface roughening treatment. In one embodiment, roughness imparted to an electrodeposited copper layer 72 during electrodeposition that increases roughness beyond that of a standard profile surface is considered to be an added surface roughening. In one embodiment, any roughness imparted to base surface 72a of copper layer 72 that increases the roughness of said copper layer 72 beyond that of a standard profile surface is considered to be added surface roughening. In one embodiment, any roughness imparted to base surface 72a of copper layer 72 that increases the roughness of said copper layer 72 beyond that of a low-profile surface is considered to be added surface roughening. In one embodiment, any roughness imparted to base surface 72a of copper layer 72 that increases the roughness of copper layer 72 beyond that of a very low-profile surface is considered to be added surface roughening.

In one embodiment, base surface 72a of copper layer 72 is untreated. The term "untreated" is used herein to refer to base surface 72a of copper layer 72 that has not undergone subsequent treatment for the purpose of refining or enhancing the foil properties and/or increasing surface roughness.

In one embodiment, the untreated copper layers 72 have a naturally occurring, non-dendritic or non-nodular layer of copper oxide or another metal or metal alloy adhered to base surface 72a thereof. The naturally occurring non-dendritic layer is not an added metal treatment.

In one embodiment, base surface 72a of copper layer 72 is treated with one or more surface treatment layers for the purpose of refining or enhancing the foil properties, but not to add surface roughness.

For example, the surface treatments include the application of a metal layer which does not increase the surface roughness wherein the metal is indium, zinc, tin, nickel, chromium, cobalt, copper alloys such as copper-tin alloy, copper-zinc alloy and mixtures of two or more thereof Metal layers of this type are sometimes referred to as barrier layers. These metal layers preferably have thicknesses in the range of about 0.01 to about 1 micron, more preferably about 0.05 to about 0.1 micron.

The surface treatments also include the application of a metal layer which does not increase the surface roughness wherein the metal is chromium, zinc, tin, nickel, molybdenum, aluminum, or a mixture of two or more thereof. Metal layers of this type are sometimes referred to as stabilization layers and/or antioxidant layers. These stabilization layers can be applied to base surface 72a of copper layer 72, or they can be applied to a previously applied barrier layer. These stabilization layers preferably have thicknesses in the range of about 0.005 to about 0.05 micron, more preferably about 0.01 to about 0.02 micron. Other conventionally known treatments, such as benzotriazole (BTA), basic organic amines and other stabilizers and/or antioxidants may be used.

In one embodiment, one or both base surface 72a of copper layer 72 is first treated with at least one barrier layer. In another embodiment, one or both base surfaces 72a of copper layers 72 is first treated with at least one stabilization layer. In yet another embodiment, one or both base surfaces 72a of copper layers 72 is first treated with at least one barrier layer, then at least one of base surfaces 72a is treated with at least one stabilization layer prior to practicing the inventive method.

As will be appreciated by those skilled in the art, barrier layers, stabilization layers or combinations thereof may be applied to a roughened or non-roughened surface 72a of copper layer 72.

Still further, an adhesion promoting layer, such as for example, a silane layer may be applied to a roughened or non-roughened surface 72a, or onto any of the aforementioned barrier or stabilization layers in any combination, that may exist on top of the roughened or non-roughened surface 72a.

The following examples are provided for the purpose of illustrating the invention. Unless otherwise indicated, as well as throughout the specification and claims, all parts and percentages are by weight, all temperatures are in degrees Celsius, and all pressures are atmospheric.

EXAMPLE 1

In the cleaning process, a 1.5 mil thick INVAR® strip 12 is cleaned to remove organic impurities. Strip 12 is treated as an anode, against a dimensionally stable cathode, in an alkaline cleaner containing about 20 g/l NaOH, about 40 g/l $Na_3PO_4$, and about 20 g/l $Na_2CO_3$. A dc current density of 30 asf is applied for 20–30 seconds. The cleaned strip 12 is then rinsed with de-ionized water and then acid etched in an aqueous 1:1 diluted HCl solution for 20 seconds to remove surface oxides and residual inorganic impurities. The acid etched strip 12 is again rinsed with deionized water and is then treated in a copper strike bath containing 2 g/l $Cu^{+2}$, 50 g/l $H_2SO_4$ and <1 ppm Cl. In the strike bath, strip 12 is treated as a cathode against a noble metal anode. A dc current density of 5.8 asf is applied for 30 seconds. A strike layer of copper having a thickness of about $0.05\mu$ is produced. After application of the strike layer, strip 12 (with the strike layer of copper thereon) is again rinsed with de-ionized water and treated in a copper buildup bath containing 70 g/l $Cu^{+2}$, 50 g/l $H_2SO_4$ and a low level of chloride (<1 ppm). The temperature of this bath is 60° C. A dc current density of 100 asf is applied for 160 seconds. A layer of copper on strip 12 having a resulting thickness (including the strike layer) of about $6.5\mu$ is produced.

After rinsing with de-ionized water, the sample is visually inspected. The sample is found to have sound copper deposit. The adhesion of the copper on the INVAR® is tested by applying adhesive tape to the composite and then peeling off the adhesive tape. The copper on the INVAR® shows good adhesion. The sample is then examined with SEM at 10,000×. No pinholes are found on the surface. The sample is then acid etched to dissolve all copper, and is then analyzed for total copper with an ICP (Induction-Coupled-Plasma) analyzer. The total thickness of the copper deposit is found to be 0.25 mil.

EXAMPLE 2

A 1.5 mil thick INVAR® strip 12 is treated as described above in Example 1, but without a copper strike. The finished product has poor interfacial adhesion.

EXAMPLE 3

A 1.5 mil thick INVAR® strip 12 is treated as described above in Example 1, except that the concentration of the strike bath is varied slightly. The $Cu^{+2}$ concentration varies between 2 and 5 g/l and current density varies between 2 and 6 asf. The final (buildup) step is the same, i.e., 100 asf for 160 seconds. A layer of copper on strip 12 having a resulting thickness (including the strike layer) of about $6.5\mu$ is produced. The resultant products are found to have good interfacial adhesion, no pinholes, and to have the same thickness (0.25 mil) as Example 1.

EXAMPLE 4

A 1.5 mil thick INVAR® strip 12 is treated as described in Example 1, except the final (buildup) step is varied as follows: 80 asf for 200 seconds and 150 asf for 107 seconds. A layer of copper on strip 12 having a resulting thickness (including the strike layer) of about $6.5\mu$ is produced. The resultant products are found to have good interfacial adhesion, no pinholes, and the same thickness (0.25 mil) as Example 1.

The present invention thus provides a copper on INVAR® composite that is thinner than like composites formed by a metallurgical bonding process, and further provides a composite having more consistent, uniform metallurgical properties. By depositing copper onto an INVAR® strip, certain surface characteristics, such as roughness so as to provide better surface adhesion, may be provided on the outer surface of the copper.

The foregoing description is a specific embodiment of the present invention. It should be appreciated that this embodiment is described for purposes of illustration only, and that numerous alterations and modifications may be practiced by those skilled in the art without departing from the spirit and scope of the invention. It is intended that all such modifications and alterations be included insofar as they come within the scope of the invention as claimed or the equivalents thereof.

Having described the invention, the following is claimed:

1. A method of forming a copper on INVAR® composite having a thickness less than 2 mil, comprising the steps of:
   a) conveying a clean, generally continuous strip of INVAR® having a thickness greater than 0.5 mil along a path having a plurality of locations;
   b) cleaning said strip in an alkaline solution;
   c) cleaning said strip in an acid solution;
   d) applying a metal strike layer of copper having a thickness of about $0.05\mu$ and $0.1\mu$ to said strip; and
   e) electrodepositing a copper layer having a thickness of between $1\mu$ and $50\mu$ onto said metal strike layer.

2. A method of forming a copper on INVAR® composite as defined in claim 1, wherein said step of electrodepositing includes an electrolyte solution comprised of $H_2SO_4$, $Cu^{2+}$ and low levels of chloride.

3. A method of forming a copper on INVAR® composite as defined in claim 1, wherein said metal strike layer is copper and is applied in an acid copper solution.

4. A method of forming a copper on INVAR® composite as defined in claim 3, wherein said acid copper solution is a copper pyro solution.

5. A method of forming a copper on INVAR® composite as defined in claim 3, wherein said acid copper solution is a copper cyanide solution.

6. A method of forming a copper on INVAR® composite as defined in claim 1, wherein said alkaline solution is comprised of NaOH, $Na_3PO_4$ and $Na_2CO_3$.

7. A method of forming a copper on INVAR® composite as defined in claim 6, wherein said acid solution is comprised of diluted HCl.

8. A method of forming a copper on INVAR® composite as defined in claim 7, further comprising rinsing said strip with de-ionized water after said cleaning steps.

9. A method of forming a copper on INVAR® composite, comprising the steps of:
   a) conveying a clean, generally continuous strip of INVAR® along a path having a plurality of locations;
   b) cleaning said strip in an alkaline solution comprised of NaOH, $Na_3PO_4$ and $Na_2CO_3$;
   c) cleaning said strip in an acid solution comprised of diluted HCl;
   d) applying a metal strike layer to said strip in an acid copper solution comprised of $H_2SO_4$ and between 2 g/l $Cu^{2+}$ and 5 g/l $Cu^{2+}$; and
   e) electrodepositing copper onto said metal strike layer.

10. A method of forming copper on a nickel-iron alloy component to form a composite having a thickness less than 2 mil, comprising the steps of:
    a) providing a nickel-iron alloy component having a thickness greater than 0.5 mil;
    b) cleaning said component in an alkaline solution;
    c) cleaning said component in an acid solution;
    d) applying a strike layer of copper having a thickness of between $0.05\mu$ and $0.10\mu$ to said component;
    e) immersing said component in an electrolyte bath adjacent an electrode; said electrolyte comprised of an acid solution containing $Cu^{2+}$;
    f) attaching said component to a cathodic electrical source and said electrode to an anodic electrical source;
    g) electrodepositing a copper layer having a thickness between $1\mu$ and $50\mu$ onto said strike layer on said nickel-iron alloy component by electrically charging said component and said electrode in said electrolyte bath.

11. A method of forming copper on a nickel-iron alloy component as defined in claim 10, wherein said component is an INVAR® strip.

12. A method of forming copper on a nickel-iron alloy component as defined in claim 11, wherein said INVAR® strip is continuously moving along a path that extends through said electrolyte bath.

13. A method of forming copper on a nickel-iron alloy component as defined in claim 12, wherein said electrolyte bath is comprised of:

40 to 70 g/l $Cu^{+2}$ 30 to 50 g/l $H_2SO_4$

<3 ppm $Cl^-$.

14. A method of forming copper on a nickel-iron alloy component as defined in claim 10, wherein said strike layer of copper is applied in a copper pyro solution.

15. A method of forming copper on a nickel-iron alloy component as defined in claim 10, wherein said strike layer copper is applied in a copper cyanide solution.

* * * * *